US008357434B1

(12) United States Patent
Choi et al.

(10) Patent No.: US 8,357,434 B1
(45) Date of Patent: Jan. 22, 2013

(54) APPARATUS FOR THE DEPOSITION OF A CONFORMAL FILM ON A SUBSTRATE AND METHODS THEREFOR

(75) Inventors: Dae-han Choi, Fremont, CA (US); Jisoo Kim, Pleasanton, CA (US); Eric Hudson, Berkeley, CA (US); Sangheon Lee, Dublin, CA (US); Conan Chiang, Fremont, CA (US); S. M. Reza Sadjadi, Saratoga, CA (US)

(73) Assignee: Lam Research Corporation, Fremont, CA (US)

( * ) Notice: Subject to any disclaimer, the term of this patent is extended or adjusted under 35 U.S.C. 154(b) by 1241 days.

(21) Appl. No.: 11/304,223

(22) Filed: Dec. 13, 2005

(51) Int. Cl.
*H05H 1/24* (2006.01)
(52) U.S. Cl. .................... 427/569; 427/249.1; 427/255.6
(58) Field of Classification Search .............. 427/255.6, 427/569, 249.1, 248.1
See application file for complete search history.

(56) References Cited

U.S. PATENT DOCUMENTS

| | | | |
|---|---|---|---|
| 6,616,986 B2 * | 9/2003 | Sherman | 427/562 |
| 2002/0146511 A1 * | 10/2002 | Chiang et al. | 427/248.1 |
| 2003/0054099 A1 * | 3/2003 | Jurgensen et al. | 427/248.1 |
| 2004/0221807 A1 * | 11/2004 | Verghese et al. | 118/715 |
| 2005/0003089 A1 * | 1/2005 | Won et al. | 427/249.1 |
| 2005/0084610 A1 * | 4/2005 | Selitser | 427/248.1 |
| 2006/0166183 A1 * | 7/2006 | Short et al. | 435/4 |
| 2006/0264060 A1 * | 11/2006 | Ramaswamy et al. | 438/758 |

FOREIGN PATENT DOCUMENTS

DE 19638601 * 3/2002

OTHER PUBLICATIONS

IC Knowledge LLC "Technology Badgrounder: Atomic Layer Deposition", (2004), pp. 1-7.
Robert Zorich, "Advanced Technology Report: Copper Interconnect and Low-k Dielectric Technologies", (2001), Integrated Circuit Engineering Corporation, pp. 1-272.
Morey, et al., "Itch challenges of low-k dilectrics", Jun. 1, 1999 vol. 42 issue 6, pp. 1-7.

* cited by examiner

*Primary Examiner* — Timothy Meeks
*Assistant Examiner* — Elizabeth Burkhart
(74) *Attorney, Agent, or Firm* — Beyer Law Group LLP (57) ABSTRACT

A method for depositing a conformal film on a substrate in a plasma processing chamber of a plasma processing system, the substrate being disposed on a chuck, the chuck being coupled to a cooling apparatus, is disclosed. The method includes flowing a first gas mixture into the plasma processing chamber at a first pressure, wherein the first gas mixture includes at least carbon, and wherein the first gas mixture has a condensation temperature. The method also includes cooling the chuck below the condensation temperature using the cooling apparatus thereby allowing at least some of the first gas mixture to condense on a surface of the substrate. The method further includes venting the first gas mixture from the processing chamber; flowing a second gas mixture into the plasma processing chamber, the second gas mixture being different in composition from the first gas mixture; and striking a plasma to form the conformal film.

20 Claims, 8 Drawing Sheets

APPARATUS FOR THE DEPOSITION OF A CONFORMAL FILM ON A SUBSTRATE AND METHODS THEREFOR

BACKGROUND OF THE INVENTION

The present invention relates in general to substrate manufacturing technologies and in particular to an apparatus for the deposition of a conformal film on a substrate and methods therefor.

In the processing of a substrate, e.g., a semiconductor substrate or a glass panel such as one used in flat panel display manufacturing, plasma is often employed. As part of the processing of a substrate for example, the substrate is divided into a plurality of dies, or rectangular areas, each of which will become an integrated circuit. The substrate is then processed in a series of steps in which materials are selectively removed (etching) and deposited. Control of the transistor gate critical dimension (CD) on the order of a few nanometers is a top priority, as each nanometer deviation from the target gate length may translate directly into the operational speed and or operability of these devices.

In an exemplary plasma process, a substrate is coated with a thin film of hardened emulsion (such as a photoresist mask) prior to etching. Areas of the hardened emulsion are then selectively removed, causing parts of the underlying layer to become exposed. The substrate is then placed in a plasma processing chamber on a substrate support structure comprising a mono-polar or bi-polar electrode, called a chuck. An appropriate set of plasma gases is then flowed into the chamber and struck to form a plasma to etch exposed areas of the substrate with a particular topography.

A common method of etching is called RIE (reactive ion etching). RIE combines both chemical and ion processes in order to remove material from the substrate (e.g., photoresist, BARC, TiN, Oxide, etc.). Generally ions in the plasma enhance a chemical process by striking the surface of the substrate, and subsequently breaking the chemical bonds of the atoms on the surface in order to make them more susceptible to reacting with the molecules of the chemical process. Since ion etching is mainly perpendicular, while the chemical etching is both perpendicular and vertical, the perpendicular etch rate tends to be much faster than in then horizontal direction. In addition, RIE tends to have an anisotropic profile.

A common substrate manufacturing method that uses RIE is called dual damascene, in which dielectric layers are electrically connected by a conductive plug filling a via hole. There are generally two approaches manufacture dual damascene substrates: via-first and trench-first. In one example of the via-first methodology, the substrate is first coated with photoresist and then the vias are lithographically patterned. Next, an anisotropic etch cuts through the surface cap material and etches down through the low-k layer of the substrate, and stops on a silicon nitride barrier, just above the underlying metal layer. Next, the via photoresist layer is stripped, and the trench photoresist is applied and lithographically patterned. Some of the photoresist will remain in the bottom of the via and prevent the lower portion via from being over-etched during the trench etch process. A second anisotropic etch then cuts through the surface cap material and etches the low-k material down to a desired depth. This etch forms the trench. The photoresist is then stripped and the Silicon Nitride barrier at the bottom of the via is opened with a very soft, low-energy etch that will not cause the underlying copper to sputter into the via. As described above, the trench and via are filled with a conductive material (e.g., aluminum (Al), Copper (Cu), etc.) and polished by chemical mechanical polishing (CMP).

An alternate methodology is trench-first. In one example, the substrate is coated with photoresist and a trench lithographic pattern is applied. An anisotropic dry etch then cuts through the surface hard mask (again typically SiN, TiN or TaN) followed by stripping the photoresist. Another photoresist is applied over the trench hard mask and then the vias are lithographically patterned. A second anisotropic etch then cuts through cap layer and partially etches down into the low-k material. This etch forms the partial vias. The photoresist is then stripped for trench etch over the vias with the hard mask. The trench etch then cuts through the cap layer and partially etches the low-k material down to desired depth. This etch also clears via holes at the same time stopping on the final barrier located at the bottom of the via. The bottom barrier is then opened with a special etch.

However, escalating requirements for high circuit density on substrates may be difficult to satisfy using current plasma processing technologies. For example, sub-micron via contacts and trenches may have high aspect ratios, low-k films and complex film stacks may be sensitive to small changes in plasma recipes are used, substrate feature sizes and critical dimensions may be decreasing, and substrate topography complexity may be increasing.

One method of mitigating these effects may be the deposition of conformal films. In general, a conformal film is a relatively thin layer (often just a few atoms in thickness) that substantially covers or coats exposed surfaces of the substrate with a relatively uniform thickness. That is, the film "conforms" to the feature topology of the substrate, much like a thin coat of spray paint. In general, conformal films may be useful to smooth out undesirable roughness on surfaces during etching processes (e.g., dual damascene, etc.), such as the irregular sidewalls (e.g., line-edge roughness, standing wave patterns, etc.) typically produced by photoresist patterning (e.g., 193 nm, etc.).

A common method of producing a highly uniform conformal film may be ALD (atomic layer deposition). In a typical ALD process, the conformal film is deposited on a substrate one atomic layer at a time using pulses of gas. Once deposited, the ALD process automatically stops. That is, the process is self-limiting. However, an ALD process is typically carried out from about 200° C. to about 400° C., making the process unsuitable in a photoresist etching process. In general, photoresist generally disintegrates at temperatures above 150° C. In addition, ALD also tends to be very time consuming, since several atomic layers usually need to be added. For example, creating a conformal film on a particular substrate with a thickness of 1000 Å may take over 100 minutes. Furthermore, ALD is also limited in the materials that may be deposited. For example, ALD usually can not deposit carbon, hydrocarbon, and/or fluorocarbon films, which may be useful in plasma processing.

Another method of producing a conformal film may be chemical vapor deposition (CVD) in which deposited species are formed as a result of chemical reaction between gaseous reactants at elevated temperature in the vicinity of the substrate. In addition, unlike ALD, the deposition process may be fairly rapid. For example, creating a conformal film with a thickness of 1000 Å may take about 30 seconds. However, like ALD, CVD reactions are typically carried out at high temperature, often above 400° C., making CVD also unsuitable for use in a photoresist etching process. Furthermore, since a CVD reaction tends to complete before the process reactants are able to substantially diffuse along substrate surfaces, high-aspect ratio structures are generally not penetrated, and rough substrate surface areas tend to remain. That is, CVD tends to achieve a relatively low level of conformality in complex substrate topographies.

In view of the foregoing, there are desired apparatus for the deposition of a conformal film on a substrate and methods therefor.

SUMMARY OF THE INVENTION

The invention relates, in one embodiment, to a method for depositing a conformal film on a substrate in a plasma processing chamber of a plasma processing system, the substrate being disposed on a chuck, the chuck being coupled to a cooling apparatus. The method includes flowing a first gas mixture into the plasma processing chamber at a first pressure, wherein the first gas mixture includes at least carbon, and wherein the first gas mixture has a condensation temperature. The method also includes cooling the chuck below the condensation temperature using the cooling apparatus thereby allowing at least some of the first gas mixture to condense on a surface of the substrate. The method further includes venting the first gas mixture from the processing chamber; flowing a second gas mixture into the plasma processing chamber, the second gas mixture being different in composition from the first gas mixture; and striking a plasma to form the conformal film.

The invention relates, in one embodiment, to a method for depositing a conformal film on a substrate in a plasma processing chamber of a plasma processing system, the substrate being disposed on a chuck. The method includes flowing a gas mixture into the plasma processing chamber at a first pressure, wherein the gas mixture includes at least carbon, wherein the first gas mixture has a condensation temperature, and wherein the chuck is at a chuck temperature below the condensation temperature, thereby allowing at least some of the first gas mixture to condense on a surface of the substrate. The method also includes venting the first gas mixture from the processing chamber. The method further includes flowing a second gas mixture into the plasma processing chamber, the second gas mixture being different in composition from the first gas mixture; and striking a plasma to form the conformal film.

The invention relates, in one embodiment, to an apparatus for depositing a conformal film on a substrate in a plasma processing chamber of a plasma processing system, the substrate being disposed on a chuck, the chuck being coupled to a cooling apparatus. The apparatus includes means of flowing a first gas mixture into the plasma processing chamber at a first pressure, wherein the first gas mixture includes at least carbon, and wherein the first gas mixture has a condensation temperature. The apparatus also includes means of cooling the chuck below the condensation temperature using the cooling apparatus thereby allowing at least some of the first gas mixture to condense on a surface of the substrate. The apparatus further includes means of venting the first gas mixture from the processing chamber; means of flowing a second gas mixture into the plasma processing chamber, the second gas mixture being different in composition from the first gas mixture; and means of striking a plasma to form the conformal film.

The invention relates, in one embodiment, to a method for depositing a conformal film on a substrate in a plasma processing chamber of a plasma processing system, the substrate being disposed on a chuck. The method includes flowing a first gas mixture into the plasma processing chamber at a first pressure for a predefined time, the predefined time being sufficient for an adsorbate to form on the surface of the substrate, wherein the first gas mixture includes at least carbon. The method also includes venting the first gas mixture from the processing chamber. The method further includes flowing a second gas mixture into the plasma processing chamber, the second gas mixture being different in composition from the first gas mixture; and striking a plasma to form the conformal film.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

While not wishing to be bound by theory, the inventors believe that a substantially uniform conformal film, such as a polymer, may be deposited on the substrate surface by first allowing a surface modifier (e.g., condensate, adsorbate, etc.) to form on the substrate surface (without plasma substantially present), and then expose that surface modifier to a plasma. In general, the surface modifier includes at least one of carbon, hydrocarbon. Typically, although not always, the plasma is a low pressure plasma. That is, the plasma is sustained at near-vacuum. However, in an embodiment, the plasma may be an atmospheric plasma. In an embodiment, the plasma comprises at least one of hydrogen, argon, and nitrogen. In another embodiment, the plasma does not include carbon.

In addition, unlike techniques such as ALD and CVD, the invention allows deposition of a surface modifier at a relatively low temperatures (<150° C.), allowing a photoresist mask to remain substantially intact. Furthermore, since several atomic layers may be deposited per processing step (unlike ALD), the process may be completed relatively quickly (about 7 minutes per substrate).

Furthermore, unlike CVD, since the plasma may be struck at any time after the surface modifier is deposited, process reactants are able to substantially diffuse along substrate surfaces. Thus, high-aspect ratio structures may be penetrated and rough substrate surfaces may be eliminated. That is, the current invention is able to achieve a relatively high level of conformality in complex substrate topographies. In addition, the invention, unlike CVD methodologies, is able to deposit polymers.

The invention also benefits from being self-limiting (like ALD) in that once the surface modifier is converted to a conformal film, the plasma process substantially stops since there is generally no more condensate with which to react. In addition, since the conformality or uniformity of a surface modifier layer is substantially high, it is relatively easy to maintain that conformality for any subsequent layers that are deposited. In an embodiment, the polymerization reaction may be driven by UV radiation from the plasma.

One type of surface modifier may be a condensate. In general, condensation is the process of converting a gas into a liquid. A condensate is generally a substance produced by conversion of a substance from a gaseous state to a liquid state. In addition, condensation temperature is generally the temperature at which a gaseous substance becomes a liquid. Thus, at a given pressure, when a condensation temperature of a gas is higher than a surface temperature in contact with the gas, such as the substrate, the gas generally condenses on that surface. In an embodiment, plasma chamber surfaces exposed to a gas, other than the substrate surface, are maintained at a temperature above the condensation temperature of the gas in order to minimize a condensate from forming on surfaces other than the substrate.

In an embodiment, a chiller (e.g., cooling apparatus, etc.) is used to cool the substrate below the condensation temperature of the gas. Generally, in a plasma chamber, the substrate is placed on a chuck with a set of cooling cavities. A cooling system generally pumps a coolant through the set of cooling cavities within the chuck, order to achieve thermal equilibrium once the plasma is ignited. However, since no plasma is substantially present during the condensation process, the cooling system may be used instead to reduce the substrate temperature below the gas condensation point.

Additionally, the inventors believe that the use of a condensate is particularly novel. In plasma processing, liquids are generally only used prior to the plasma etching process (e.g., wet cleaning, wet etching, etc.) since liquids tend to leave residues that can interfere with further processing. In particular, plasma chambers are specifically configured to substantially reduce condensation, such as atmospheric moisture, that tends to react with plasma gas to damage the substrate. For instance, moisture may react with chlorine absorbed on the substrate to form hydrochloric acid, which can etch aluminum and cause metal corrosion.

Another type of surface modifier may be an adsorbate. In general, adsorption is the attachment of one substance to the surface of another, resulting in a relatively high concentration of the gas at the surface. The adsorbate is generally the substance that is adsorbed and is generally loosely held by weak attraction to the surface.

Referring now to FIGS. 1A-D, a simplified set of diagrams in which the addition of a conformal film to a substrate is shown, according to an embodiment of the invention. In general, the composition of the conformal film depends on the gas chemistry (pre-plasma) and the plasma chemistry. In addition, the properties of the conformal film, such as the conformality, may potentially be controlled by adjusting the following properties and parameters: gas vapor pressure, liquid viscosity, liquid-surface interface energy, substrate temperature, surface pre-conditioning, gas delivery pressure, gas dilution, exposure time, plasma density, plasma chemistry, ion bombardment energy, angular distribution, flux of UV and x-rays produced by plasma, flux of reactive radicals, plasma time, etc.

Figure 1A:
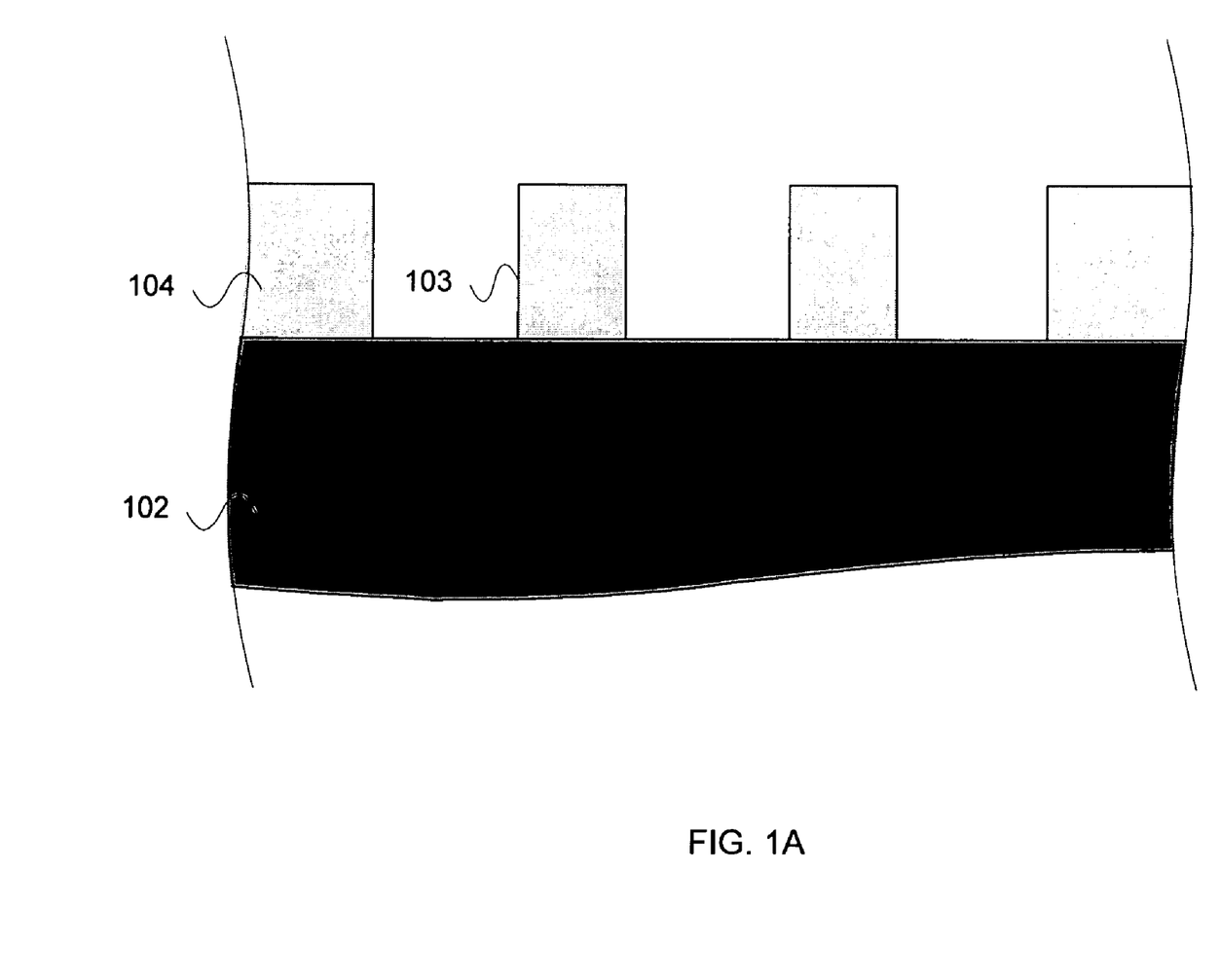
FIGS. 1A-D show a simplified set of diagrams in which a conformal film is added to a substrate, according to an embodiment of the invention.

Referring now to FIG. 1A, a simplified diagram of a partially etched substrate is shown. In general, integrated circuits are sequentially created by forming a set of patterned layers 104 on substrate 102. For example, the set of patterned layers 104 may be lithographically patterned photoresist in a trench-first dual-damascene process. Generally, the vertical profile or shape 103 of the set of patterned layers 104 strongly influences the resulting etch pattern of any substrate layers below it (e.g., towards the chuck).

Figure 1B:
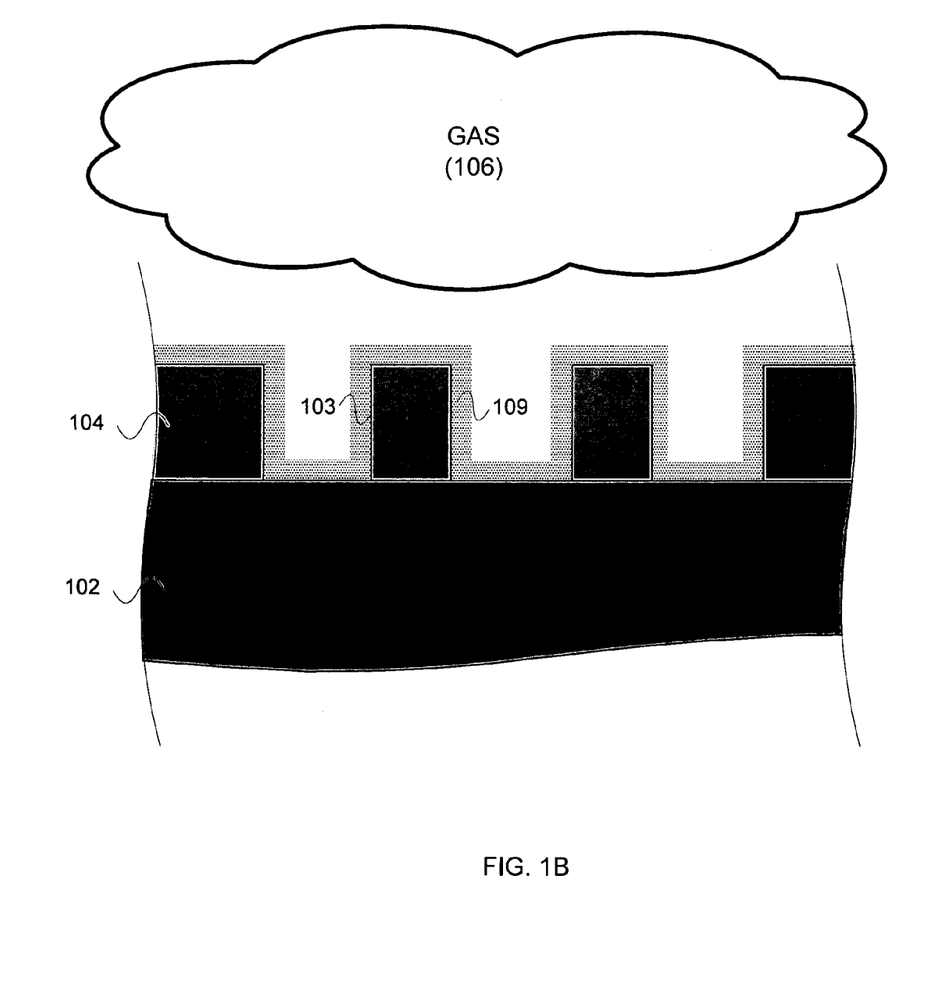

Referring now to FIG. 1B, the partially etched substrate of FIG. 1 is shown, with the addition of a gas comprising carbon. In an embodiment, just any gas comprising $C_xH_xF_z$ may be used, where x is an integer greater than 0, and y and z are integers greater than or equal to zero. In the case of a condensate, once substrate 102 is cooled below the boiling point of gas 106, a surface modifier 109 begins to form on surfaces that are exposed to gas 106. Otherwise, in the case of an adsorbent, a surface modifier 109 begins to form on surfaces that are exposed to gas 106.

Figure 1C:
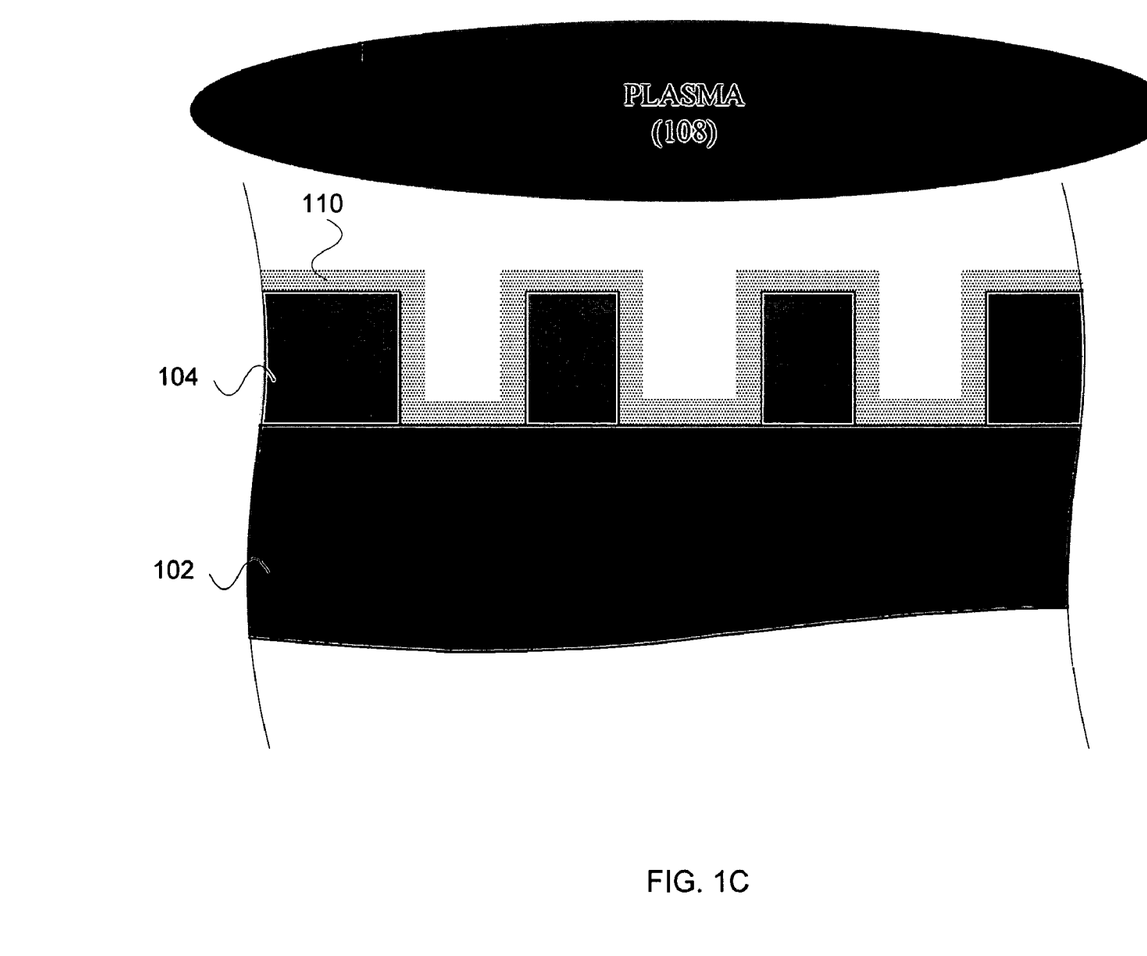

Referring now to FIG. 1C, the partially etched substrate of FIG. 1B is shown, in which excess gas [not shown] is purged from the plasma chamber, after which a plasma 108 is struck. It is believed that ions in the plasma combine with carbon molecules in order to create a conformal film comprised of organic polymer chains. In general, organic bonds tend to be strong (i.e., C—H, C—C, C=C, C—O, etc.), since cross-linked relatively stable structures are created.

Figure 1D:
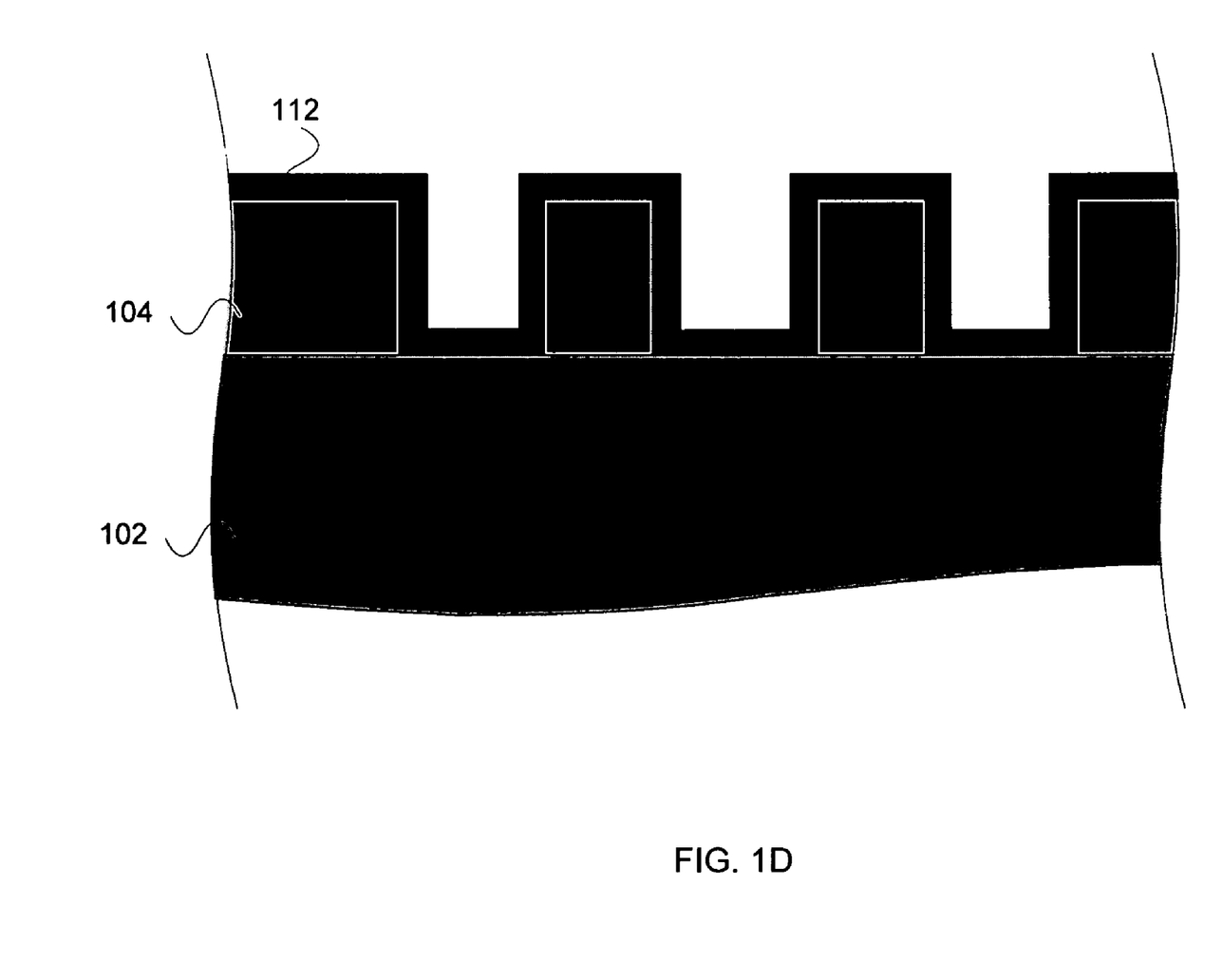

Referring now to FIG. 1D, the partially etched substrate of FIG. 1C is shown, in which the conformal film has been formed. In an embodiment, a conformal film 112 of about 30 nm may be deposited per gas condensation-plasma cycle. In general, a thicker conformal film 112 may be deposited by repeating several gas condensation-plasma cycles.

Figure 2A:
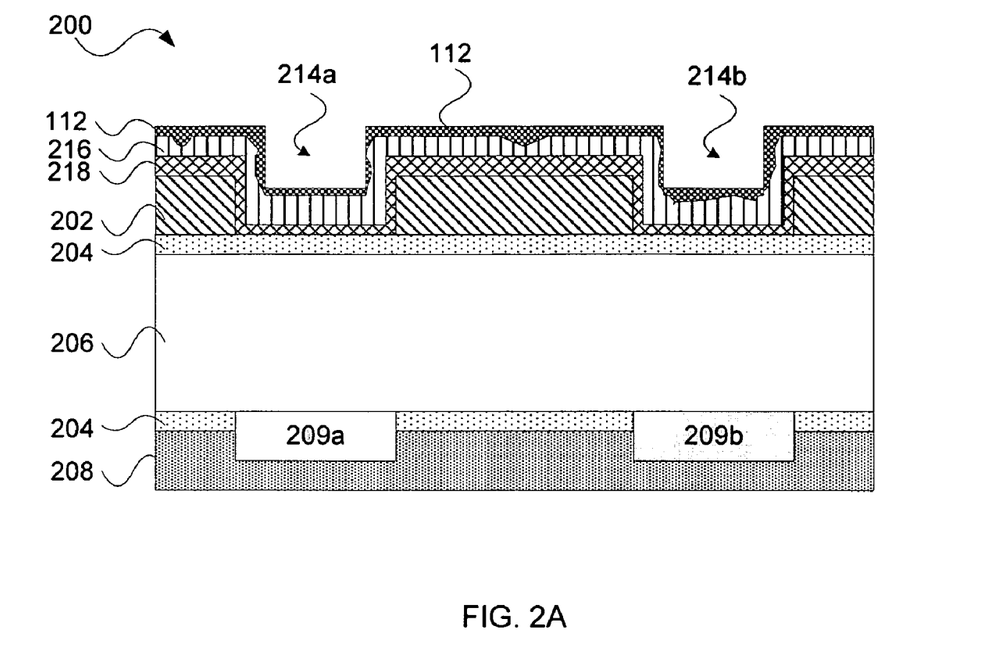
FIGS. 2A-B show a simplified set of diagrams of a trench first dual damascene process with a conformal film, according to an embodiment of the invention.
Figure 2B:
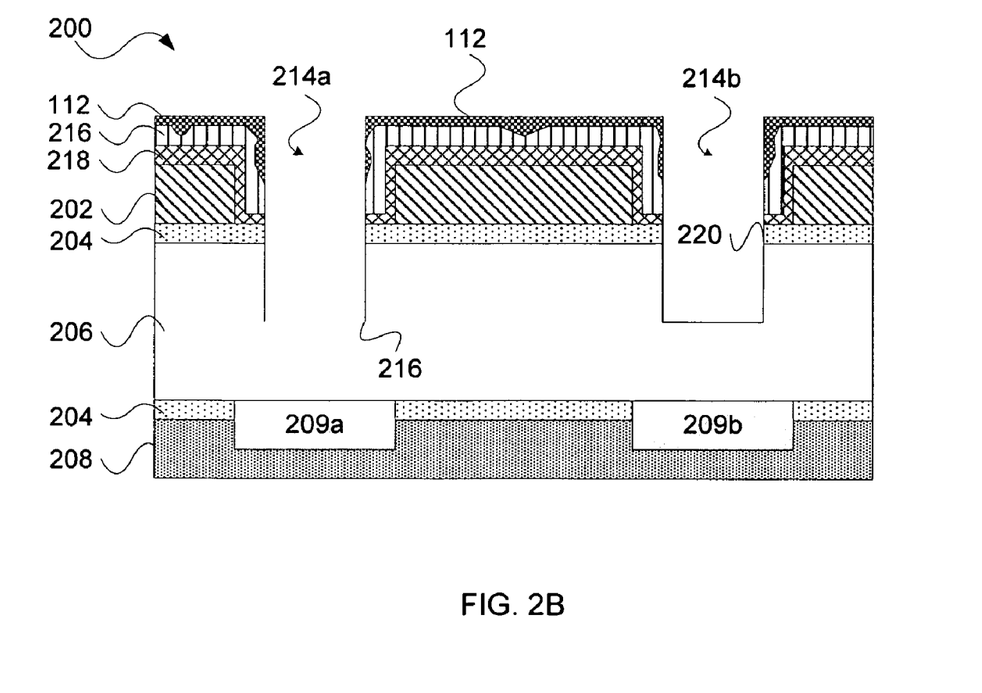

In another embodiment, a conformal film may be used to optimize substrate etching. Referring now to FIGS. 2A-B, a simplified set of diagrams in which a trench first dual damascene process with a conformal film is shown, according to an embodiment of the invention. FIG. 2A illustrates an idealized cross-sectional view of a layer stack 200, representing the layers of an exemplar semiconductor IC, after a trench mask layer has been processed in the plasma system.

At the bottom of layer stack 200, there is shown a layer 208, comprising $SiO_2$. Above layer 208 is disposed a barrier layer 204, typically comprising nitride or carbide (SiN or SiC). Dual damascene substrates further comprise a set of metal layers including M1 209a-b, typically comprising aluminum or copper. Above the barrier layer 204, is disposed an intermediate dielectric (IMD) layer 206, comprising a low-k material (e.g., SiOC, etc.). Above the IMD layer 206, there may be placed a cap layer 204, typically comprising $SiO_2$. Above cap layer 204, there may be disposed a trench mask layer 202, typically comprising TiN, SiN, or TaN. Above trench mask layer 202 may be disposed a photoresist layer 216 and a BARC layer 218, in order to create a second metal layer and a via connecting it to the first metal layer 209a-b. However, in this example, photoresist 216 patterning has undesirable roughness that may affect a subsequent etch. By the deposition of a conformal film 112, the undesirable roughness may be smoothed out.

FIG. 2B shows the cross-sectional view of layer stack 200 of FIG. 2A after the photoresist layer has been opened and an etch has been performed to partially etch into IMD layer 206 to create a via. The addition of conformal film 112 has allowed a substantially vertical profile 220 to be maintained during the etching process.

Figure 3:
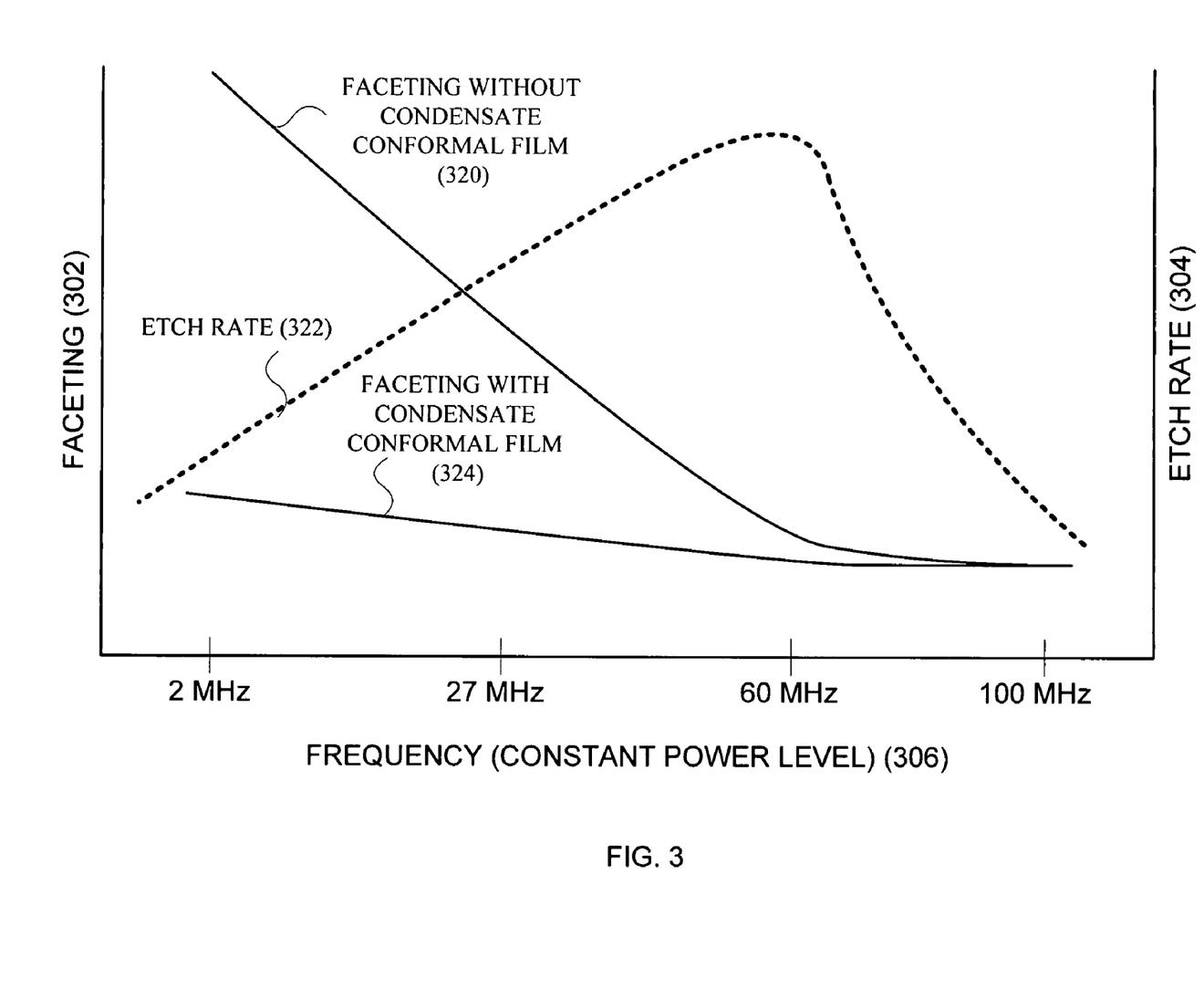
FIG. 3 shows a simplified diagram comparing faceting plots and an etch rate plot at a given power level, according to an embodiment of the invention.

Referring now to FIG. 3, a simplified diagram comparing a faceting plot without the presence of a conformal film 320, a faceting plot with the presence of a conformal film 324, and an etch rate plot 322 as a function of the bias rf (shown on axis 306) at a given power level.

Generally speaking, a low bias rf (generally below 60 MHz) tends to result in higher ion energy, which leads to faceting and/or corner sputtering if the RF bias signal not optimized. Likewise, a high bias rf (generally above about 60 MHz) tends to cause plasma ions take several rf cycles to cross the sheath, resulting in lower ion energy, which results in inadequate etching or non-anisotropic etching if the rf bias signal is not optimized. For example, as bias rf frequency is increased, the etch rate increases and the amount of faceting/corner sputtering decreases (e.g., from about 2 MHz to about 60 MHz). In particular, the increase in etch rate is rapid to about 30 MHz, and then increases less rapidly to about 60 MHz where the etch rate essentially flattens out until about 70 MHz. After about 70 MHz, the etch rate begins to slow down dramatically (e.g., from about 70 MHz to about 100 MHz), signifying that the ion energy level is now below what is necessary for an efficient etch.

However, the addition of a conformal film may substantially reduced faceting across a substantially large rf spectrum. For example, at a lower rf range (about less than 60 MHz), faceting with conformal film 324 is substantially less when compared to faceting without conformal film 320. Thus the invention may provide substantial advantages during plasma etching processes.

For example, new high performance low-k materials are being used as interconnect dielectrics in place of traditional oxides for high-performance devices. However, because many of these materials have a high-carbon content, these materials also tend to be susceptible to pitting and severe dimensional changes during plasma processes. Subsequently, narrowly tailored plasma recipes (including narrow rf ranges) often have to be employed in order to successfully manufacture substrates with these materials. However, the use of a conformal film may allow a substantially broader rf spectrum (e.g., below about 60 MHz, etc.) to be employed, increasing the flexibility of process parameters while minimizing damage to the high performance low-k materials.

In another embodiment, a conformal film may be used as a pre-coat passivation layer. Generally, after each set of plasma processing steps, a dry cleaning, waferless cleaning, or preventive maintenance procedure is performed to remove micro-particles and residue polymers that are attached to the interior surfaces of the reaction chamber. In a non-obvious fashion, by pre-coating the plasma chamber with a conformal film prior to insertion of a subsequent substrate, by a material to which an etchant has an affinity, the effective amount of etchant radicals in the plasma may be reduced, thus optimizing the etch rate (e.g., in order to maintain photoresist integrity, etc.).

For example, many photoresist etchants comprise oxygen. Pre-coating the chamber with a conformal film to which oxygen has an affinity, such as a polymer that includes $Cl_2$, will reduce the effective amount of oxygen radicals in the plasma that are available to etch the photoresist. In general, the greater the amount of pre-coat material, the fewer the number of available oxygen radicals available to the etching process. In addition, a controllable polymer passivation layer may be created through reaction of the pre-coat with the photoresist etchant, further optimizing the etching process in order to preserve photoresist integrity. That is, the polymer passivation layer may inhibit both vertical erosion of the photoresist mask and lateral erosion, which may be valuable in maintaining the CD of the substrate.

Figure 4:
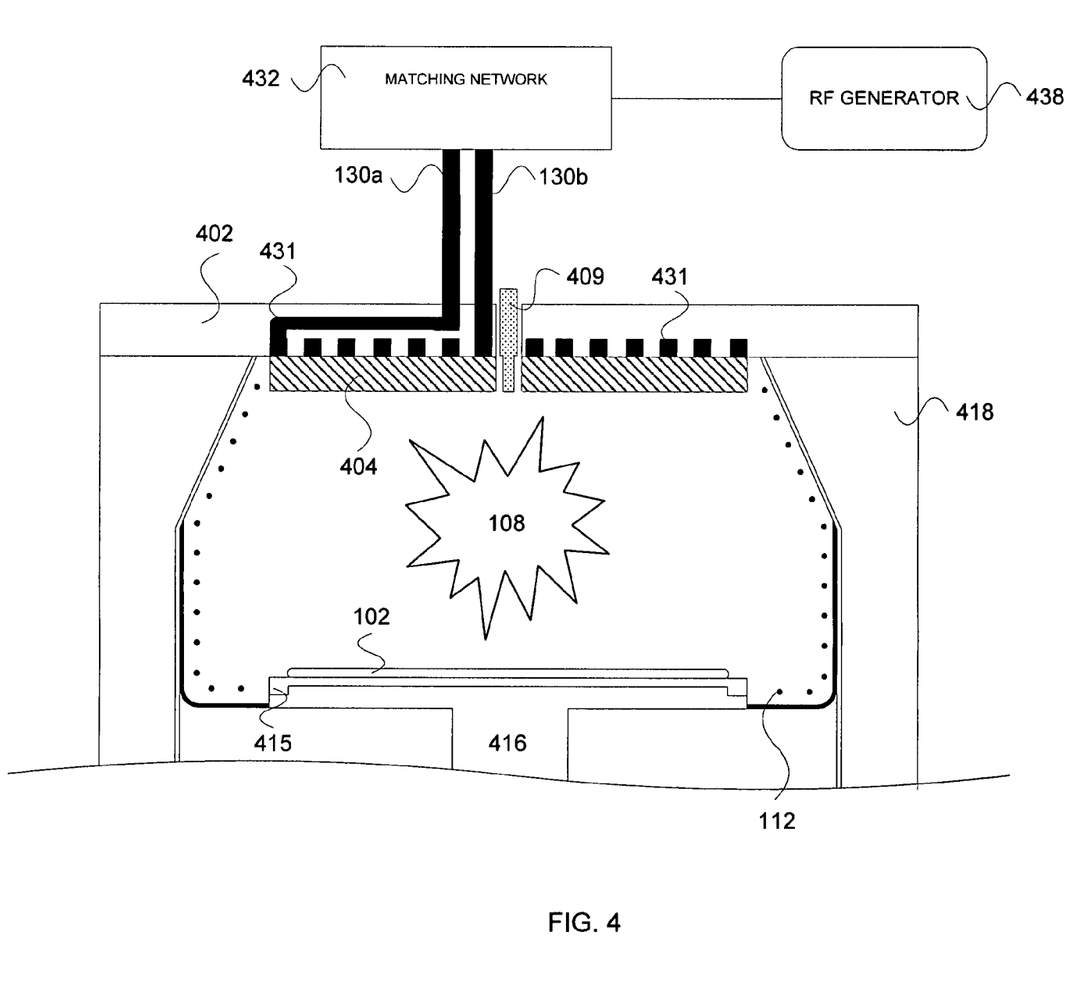
FIG. 4 shows a simplified diagram of an inductively coupled plasma processing system with a polymer passivation layer, according to an embodiment of the invention.

Referring now to FIG. 4, a simplified diagram of an inductively coupled plasma processing system that has been pre-coated with a conformal film is shown, according to an embodiment of the invention. In an embodiment, other types of plasma processing systems may be used (e.g., capacitively coupled, atmospheric, etc.). In general, an appropriate set of gases is flowed into chamber 402 through an inlet 409 from a gas distribution system (not shown). These plasma processing gases may be subsequently ionized to form a plasma 108, in order to process (e.g., etch or deposition) exposed areas of substrate 102, such as a semiconductor substrate or a glass pane, positioned with edge ring 415 on an electrostatic chuck 416.

Induction coil 431 is separated from the plasma by a dielectric window 404, and generally induces a time-varying electric current in the plasma processing gases to create plasma 108. The window both protects induction coil from plasma 108, and allows the generated rf field to penetrate into the plasma processing chamber. Further coupled to induction coil 431 is matching network 432 that may be further coupled to RF generator 438. Matching network 132 attempts to match the impedance of RF generator 438, which typically operates at 13.56 MHz and 50 ohms, to that of the plasma 108. However, prior to processing the substrate, a conformal film 112 may be added that may react with photoresist etchant radicals to subsequently optimize the etching process. In an embodiment, conformal film 112 is added prior to inserting substrate 102 in plasma chamber 402. In an embodiment, a single conformal film 112 deposition may allow multiple substrates 102 to be processed, before a second conformal film 112 needs to be deposited.

Figure 5:
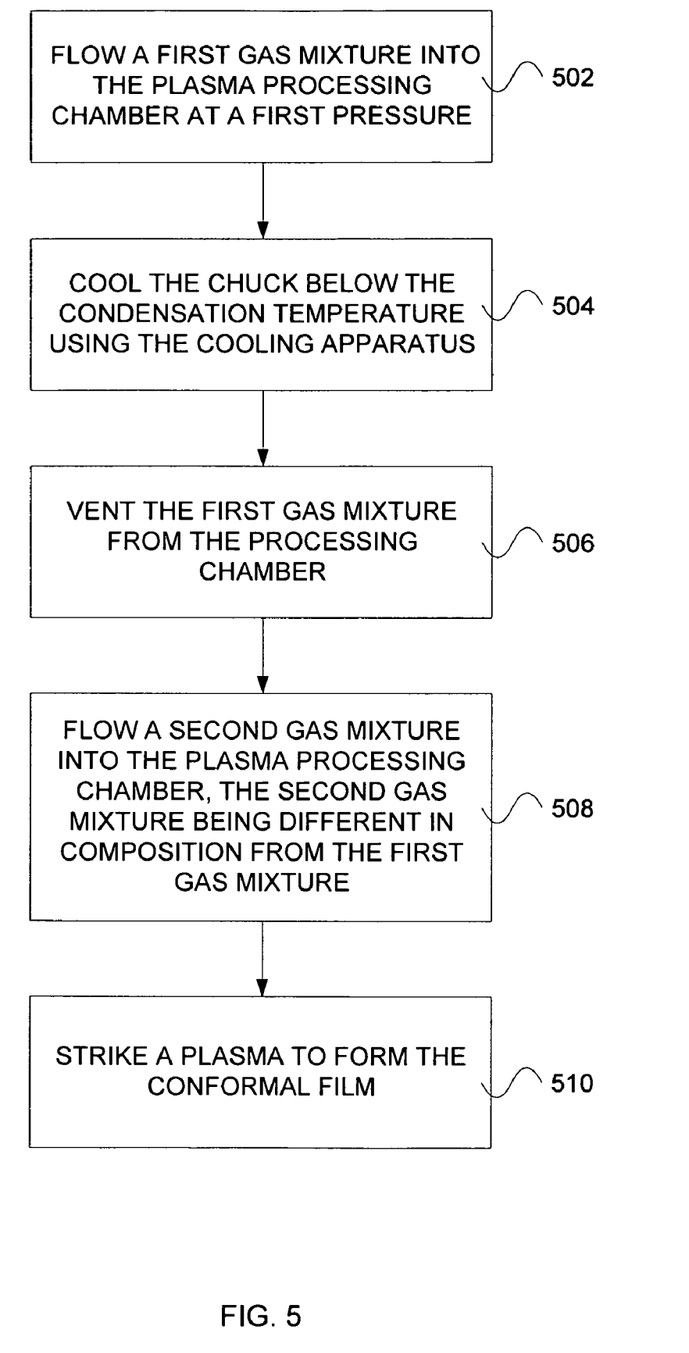
FIG. 5 shows a simplified method for the deposition of a conformal film according to an embodiment of the invention.

Referring now to FIG. 5, a simplified method for the deposition of a conformal film is shown, according to an embodiment of the invention. As previously described, the substrate is generally disposed on a chuck, which in turn, is generally coupled to a cooling apparatus. However, in other embodiments, the chuck, and hence the substrate, may be maintained at a temperature below the condensation temperature of the carbon containing gas mixture (e.g., first gas mixture) without a cooling apparatus. For example, the chuck and substrate may be maintained at ambient temperature. Likewise, the chuck may be allowed to cool down after a prior plasma process.

Initially, at step 502, a first gas mixture is flowed into the plasma processing chamber at a first pressure, wherein the first gas mixture includes at least carbon, and wherein the first gas mixture has a condensation temperature. Next, at 504, the chuck is cooled below the condensation temperature using the cooling apparatus thereby allowing at least some of the first gas mixture to condense on a surface of the substrate. Next, at 506, the first gas mixture is vented from the processing chamber. Next, at 508, a second gas mixture is flowed into the plasma processing chamber, the second gas mixture being different in composition from the first gas mixture. Finally, at 510, a plasma is struck to form the conformal film.

While this invention has been described in terms of several preferred embodiments, there are alterations, permutations, and equivalents which fall within the scope of this invention. For example, although the present invention has been described in connection with Lam Research plasma processing systems (e.g., Exelan™, Exelan™ HP, Exelan™ HPT, 2300™, Versys™ Star, etc.), other plasma processing systems may be used. This invention may also be used with substrates of various diameters (e.g., 200 mm, 300 mm, LCD, etc.). Furthermore, the term set as used herein includes one or more of the named element of the set. For example, a set of "X" refers to one or more "X."

Advantages of the invention include the deposition of a conformal film on a substrate. Additional advantages include the elimination of rough substrate surfaces, the penetration of high-aspect ratio structures, the deposition of a pre-coat passivation layer in a plasma chamber, the ability to achieve a relatively high level of conformality in complex substrate topographies, the deposition of a conformal film at a greater rate than ALD, the deposition of carbon, hydrocarbon, and/or fluorocarbon films, the deposition of the film at relatively low temperatures (about <150° C.), and the enlargement of the plasma process window.

Having disclosed exemplary embodiments and the best mode, modifications and variations may be made to the disclosed embodiments while remaining within the subject and spirit of the invention as defined by the following claims.

What is claimed is:

1. A method for depositing a conformal film on a substrate in a plasma processing chamber of a plasma processing system, said substrate being disposed on a chuck, said chuck being coupled to a cooling apparatus, said method comprising:
    flowing a first gas mixture into said plasma processing chamber at a first pressure, wherein said first gas mixture has a condensation temperature;
    cooling said chuck below said condensation temperature using said cooling apparatus after said flowing said first gas mixture into said plasma processing chamber at said first pressure, thereby allowing at least some of said first gas mixture to condense on a surface of said substrate;
    venting said first gas mixture from said processing chamber;
    flowing a second gas mixture into said plasma processing chamber, said second gas mixture being different in composition from said first gas mixture; and
    striking a plasma to form said conformal film.

2. The method of claim 1, wherein said second gas mixture is at a second pressure.

3. The method of claim 2, wherein said second gas mixture includes at least one of hydrogen, argon, and nitrogen.

4. The method of claim 3, wherein after said step of cooling said chuck below said condensation temperature, flowing said first gas mixture for a predefined time, said predefined time being sufficient for said condensate to form on said surface of said substrate.

5. The method of claim 4, wherein said plasma processing chamber includes a set of plasma chamber surfaces that is at a chamber temperature that is higher than said condensation temperature.

6. The method of claim 5, wherein said first gas mixture includes CxHyFz, where x is an integer greater than 0, and y and z are integers each being greater than or equal to zero.

7. The method of claim 6 wherein said plasma processing system is one of an inductively-coupled plasma processing system, a capacitively-coupled plasma processing system, and an atmospheric plasma processing system.

8. The method of claim 7 wherein said substrate represents one of a semiconductor wafer for producing integrated circuit and a flat panel substrate.

9. The method of claim 8 wherein said first pressure is atmospheric pressure.

10. The method of claim 9 wherein said second pressure is a near-vacuum pressure.

11. The method of claim 10 wherein a temperature of said substrate is less than about 150° C. while said condensate is formed from said first gas mixture.

12. A method for depositing a conformal film on a substrate in a plasma processing chamber of a plasma processing system, said substrate being disposed on a chuck, said method comprising:
    flowing a first gas mixture into said plasma processing chamber at a first pressure, wherein said gas mixture includes at least carbon, wherein said first gas mixture has a condensation temperature;
    cooling said chuck after said flowing said gas mixture into said plasma processing chamber at said first pressure to reduce a chuck temperature of said chuck to be below said condensation temperature, thereby allowing at least some of said first gas mixture to condense on a surface of said substrate;
    venting said first gas mixture from said processing chamber;
    flowing a second gas mixture into said plasma processing chamber, said second gas mixture being different in composition from said first gas mixture; and
    striking a plasma to form said conformal film.

13. A method for depositing a conformal film on a substrate in a plasma processing chamber of a plasma processing system, said substrate being disposed on a chuck, said method comprising:
    providing a first coating film on a surface of said plasma processing chamber inside said plasma processing chamber;
    inserting said substrate into said plasma processing chamber after said providing said first coating film on said surface of said plasma processing chamber;
    flowing a first gas mixture into said plasma processing chamber at a first pressure for a predefined time, said predefined time being sufficient for an adsorbate to form on said surface of said substrate wherein said forming of the adsorbate comprises condensing the first gas mixture, wherein said first gas mixture includes at least carbon;
    venting said first gas mixture from said processing chamber;
    flowing a second gas mixture into said plasma processing chamber, said second gas mixture being different in composition from said first gas mixture;
    striking a plasma to form said conformal film;
    processing at least a second substrate when at least a portion of said first coating film exists on said surface of said plasma processing chamber inside said plasma processing chamber; and
    providing a second coating film on said surface of said plasma processing chamber inside said plasma processing chamber after said second substrate has been processed in said plasma processing chamber.

14. The method of claim 13, wherein said second gas mixture is at a second pressure.

15. The method of claim 14, wherein said second gas mixture includes at least one of hydrogen, argon, and nitrogen.

16. The method of claim 15, wherein said first gas mixture includes CxHyFz, where x is an integer greater than 0, and y and z are integers each being greater than or equal to zero.

17. The method of claim 16 wherein said plasma processing system is one of an inductively-coupled plasma processing system, a capacitively-coupled plasma processing system, and an atmospheric plasma processing system.

18. The method of claim 17 wherein said substrate represents one of a semiconductor wafer for producing integrated circuit and a flat panel substrate.

19. The method of claim 18 wherein said first pressure is atmospheric pressure.

20. The method of claim 19 wherein said second pressure is a near-vacuum pressure.

* * * * *